United States Patent [19]

Nonaka et al.

[11] Patent Number: 5,001,110
[45] Date of Patent: Mar. 19, 1991

[54] ORGANOMETALLIC SOLUTIONS FOR FORMING OXIDE SUPERCONDUCTING FILMS

[75] Inventors: Toshihisa Nonaka, Osaka; Keisuke Kobayashi, Shiga; Hiroyuki Igaki, Shiga; Michiyasu Matsuki, Shiga, all of Japan

[73] Assignee: Toray Industries, Inc., Tokyo, Japan

[21] Appl. No.: 379,972

[22] Filed: Jul. 14, 1989

Related U.S. Application Data

[62] Division of Ser. No. 200,515, May 26, 1988, Pat. No. 4,920,093.

[30] Foreign Application Priority Data

| | | | |
|---|---|---|---|
| May 29, 1987 | [JP] | Japan | 62-131093 |
| Jul. 24, 1987 | [JP] | Japan | 62-186304 |
| Jan. 25, 1988 | [JP] | Japan | 63-14009 |

[51] Int. Cl.$^5$ ............................................... C09K 3/00
[52] U.S. Cl. ......................................... 505/1; 505/734; 505/735; 106/287.18; 106/287.23; 427/226; 427/62; 427/63; 501/152; 556/28
[58] Field of Search .................. 556/28; 501/152, 12; 106/287.18, 287.23; 505/1, 735, 734; 427/62, 63, 226, 376.2, 126.3

[56] References Cited

U.S. PATENT DOCUMENTS

| | | | |
|---|---|---|---|
| 4,636,440 | 1/1987 | Jada | 428/446 |
| 4,668,299 | 5/1987 | Nanao et al. | 106/309 |

OTHER PUBLICATIONS

Shibata et al, "Superconducting Oxides by the Sol-Gel Method Using Alkoxides", Jpn. J. Appl. Phys., vol. 27(1), Jan. 1988, L53–54.
Kramer et al., "Preparation of Thin Film YBa$_2$Cu$_3$O$_{6+x}$ Ceramic Superconductors by the Sol–Gel Process", MRS, vol. 99, Nov. 1987, pp. 323–326.
Uchikawa et al, "Fabrication of YBa$_2$Cu$_3$O$_{7-x}$ Fibers Using the Modified Sol-Gel Method", MRS ed., Capone II, Apr. 1988, pp. 89–92.
Cima et al, "Ba$_2$YCu$_3$O$_{6.9}$ Powder Preparation by Sol-gel emulsion Technique", MRS, vol. 99, Nov. 1987, pp. 241–244.

*Primary Examiner*—Norman Morgenstern
*Assistant Examiner*—Roy V. King
*Attorney, Agent, or Firm*—Birch, Stewart, Kolasch & Birch

[57] ABSTRACT

A solution for forming a superconductive thin film prepared by dissolving a mol of a compound selected from group A consisting of alkoxides and alkoxyalkoxides of a rare earth metal element; b mol of a compound selected from group B consisting of alkoxides and alkoxyalkoxides of Ba, Sr and Ca; and c mol of a compound selected from group C consisting of alkoxides and alkoxyalkoxides of Cu in e liter of a compound selected from group E, a solvent selected from alcohols together with d mol of a compound selected from group D for inhibiting hydrolysis action such as an amine, a ketone and a glycol, such that the following relationships:

$$0.1 \times (a+b+c) \leq d \leq 3 \times (a+b+c)$$

and $$0.01 \leq [(a+b+c)/e] \leq 3$$

can be satisfied.

10 Claims, No Drawings

ORGANOMETALLIC SOLUTIONS FOR FORMING OXIDE SUPERCONDUCTING FILMS

This application is a divisional of copending application Ser. No. 07/200,515, filed on May 26, 1988, now U.S. Pat. No. 4,920,093.

BACKGROUND OF THE INVENTION

This invention relates to a method of forming, on a heat-resistant substrate, a superconductive thin film having high onset transition temperature and also a narrow temperature range in which transition to superconductor occurs, which is suitably used as a magnetic coil material in fusion reactors, magnetohydrodynamic generators, accelerators, rotary electric appliances, magnetic separators, linear motor cars, nuclear magnetic resonance devices, magnetic propulsion ships, various laboratory equipments, etc.; as a power transmission material for transmission cables, energy storage device, transformers, rectifiers, phase modifiers, etc., where electrical loss is a serious factor; further as various elements such as a Josephson element, a SQUID element, etc.; and also as various sensors such as a magnetic sensor, IR sensor, etc., and to a solution for forming such superconductive thin film.

In recent years, it is practiced to form a thin film of a superconductive material comprising an oxide of a ceramic which can exhibit excellent superconductive characteristics on the surfaces of various types of substrates.

As the method of forming a thin film of a superconductive material comprising an oxide of a ceramic on the surface of a substrate, known are sputtering and screen printing.

On the former sputtering method, the following studies are disclosed: "Compositional and Structural Analyses for Optimizing the Preparation Conditions of superconducting ($La_{1-x}Sr_xCuO_{4-\delta}$) Films by Sputtering", Japanese Journal of Applied Physics, Vol. 26, No. 4, Apr., 1987, pp L388-L390, M. Kawasaki et al.; "High TC thin Films of $(La_{1-x}M_x)_yCuO_{4-\delta}$ (M=Sr, Ba, Ca) Prepared by Sputtering", ibid.; Vol. 26, No. 4, Apr., 1987, pp. L410-L412, S. Nagata et al.; "Deposition of $Sr_xLa_{2-x}CuO_{4-y}$ Thin Films by Sputtering", ibid.; Vol. 26, No. 4, Apr., 1987, pp. L508-L509, N. Terada et al.; "Josephson Junctions Observed in $La_{1.8}Sr_{0.2}CuO_4$ superconducting Polycrystalline Films", ibid.; Vol. 26, No. 4, Apr. 1987, pp. L521-L523, K. Moriwaki et al.; "Hall Effect in superconducting $(La_{1-x}Sr_x)_2CuO_4$ Single Crystal Thin Films", ibid.; Vol. 26, No. 4, Apr., 1987, pp. L524-L525, M. Suzuki et al.; "Preparation and Characterization of superconducting Y-Ba-Cu-O Thin Films", ibid.; Vol. 26, No. 5, May 1987, pp. L709-L710, H. Adachi; "Meissner Effect in High-Tc Superconductive Thin Films", ibid.; Vol. 26, No. 5, May, 1987, pp. L724-L725, S. Hatta et al.; "High Tc Yb-Ba-Cu-O Thin Films Deposited on Sintered YSZ Substrates by Sputtering", ibid.; Vol. 26, No. 5, May, 1987, pp. L738-L740, M. Kawasaki et al., etc.

On the latter screen printing method, following studies are disclosed: "Preparation of $(La_{1-x}Sr_x)_2CuO_{4-\delta}$ superconducting Films by Screen Printing Method, Japanese Journal of Applied Physics; Vol. 26, No. 4, Apr., 1987, pp. L399-L401, H. Koinuma et al.; "High-Tc Superconductivity in Screen Printed Yb-Ba-Cu-O Films", ibid.; vol. 26, No. 5, May, 1987, pp. L761-L762, H. Koinuma et al., etc.

However, in the former sputtering method, when a superconductive thin film having a homogeneous multi-component composition is to be formed on the surface of a substrate according to the above method, it is difficult to form a thin film as a single phase having the desired composition, and phases of undesired compositions may also be present, resulting in poor superconductivity.

On the other hand, the latter screen printing method, where a film is formed by coating the surface of a substrate with a paste containing particles of oxides, followed by calcination, involves a problem that a thin film having a homogeneous composition may not be obtained if the particles do not have a homogeneous composition to be liable to make the film thickness nonuniform, and further cracks and the like may readily be formed on the film.

OBJECTS AND SUMMARY OF THE INVENTION

An object of this invention is to provide a method of forming, on a heat-resistant substrate, a thin film having a film thickness in the order of nanometer (nm) and also having excellent superconductive characteristics such as onset temperature of superconductive transition and temperature range in which transition to superconductor occurs, containing substantially no extraneous substance in the grain boundary and free from cracking and the like.

Another object of this invention is to provide a method of forming a superconductive thin film by preparing a homogeneous solution containing components to constitute the superconductive thin film, and then coating a heat-resistant substrate with the solution.

Further object of this invention is to provide a solution for forming such superconductive thin film as mentioned above.

In order to achieve the above objects, there is provided a method of forming a superconductive thin film, the method comprising:
a step of preparing a solution containing a mol of at least one compound selected from the group A consisting of methoxide, ethoxide, propoxide, butoxide, methoxyethoxide and ethoxyethoxide of La; b mol of at least one compound selected from the group B consisting of methoxide, ethoxide, propoxide, butoxide, methoxyethoxide and ethoxyethoxide of a metal selected from Ba, Sr and Ca; c mol of at least one compound selected from the group C consisting of methoxide, ethoxide, propoxide, butoxide, methoxyethoxide and ethoxyethoxide of Cu; d mol of at least one compound selected from the group D consisting of monoethanolamine, diethanolamine, triethanolamine, mono-2-propanolamine, di-2-propanolamine, acetylacetone, ethylene glycol, diethylene glycol, propylene glycol and dipropylene glycol; and e liter of at least one compound selected from the group E consisting of methanol, ethanol, propanol, butanol, methoxyethanol and ethoxyethanol; and also satisfying the following equations:

$$0.1 \times (a+b+c) \leq d \leq 3 \times (a+b+c)$$

and $$0.01 \leq [(a+b+c)/e] \leq 3;$$

a step of forming a thin film of the solution as prepared above on a heat-resistant substrate;

a step of drying the film thus formed; and a step of calcining said film in an oxidative atmosphere at 350° to 1,150° C. to make said film superconductive.

Also, in another embodiment of this invention, there is provided a method of forming a superconductive thin film, the method comprising:

a step of preparing a solution containing a mol of at least one compound selected from the group A consisting of methoxide, ethoxide, propoxide, butoxide, methoxyethoxide and ethoxyethoxide of a metal selected from Y, La, Nd, Sm, Eu, Gd, Dy, Ho, Er, Tm, Yb and Lu; b mol of at least one compound selected from the group B consisting of methoxide, ethoxide, propoxide, butoxide, methoxyethoxide and ethoxyethoxide of a metal selected from Ba and Sr; c mol of at least one compound selected from the group C consisting of methoxide, ethoxide, propoxide, butoxide, methoxyethoxide and ethoxyethoxide of Cu; d mol of at least one compound selected from the group D consisting of monoethanolamine, diethanolamine, triethanolamine, mono-2-propanolamine, di-2-propanolamine, acetylacetone, ethylene glycol, diethylene glycol, propylene glycol and dipropylene glycol; and e liter of at least one compound selected from the group E consisting of methanol, ethanol, propanol, butanol, methoxyethanol and ethoxyethanol; and also satisfying the following equations:

$$0.1 \times (a+b+c) \leq d \leq 3 \times (a+b+c)$$

and $$0.01 \leq [(a+b+c)/e] \leq 3;$$

a step of forming a thin film of the solution as prepared above on a heat-resistant substrate;

a step of drying the film thus formed; and a step of calcining said film in an oxidative atmosphere at 350° to 1,100° C. to make said film superconductive.

Further, there is provided a solution for forming superconductive thin films containing: a mol of at least one compound selected from the group A consisting of methoxide, ethoxide, propoxide, butoxide, methoxyethoxide and ethoxyethoxide of La; b mol of at least one compound selected from the group B consisting of methoxide, ethoxide, propoxide, butoxide, methoxyethoxide and ethoxyethoxide of a metal selected from Ba, Sr and Ca; c mol of at least one compound selected from the group C consisting of methoxide, ethoxide, propoxide, butoxide, methoxyethoxide and ethoxyethoxide of Cu; d mol of at least one compound selected from the group D consisting of monoethanolamine, diethanolamine, triethanolamine, mono-2-propanolamine, di-2-propanolamine, acetylacetone, ethylene glycol, diethylene glycol, propylene glycol and dipropylene glycol; and e liter of at least one compound selected from the group E consisting of methanol, ethanol, propanol, butanol, methoxyethanol and ethoxyethanol; and also satisfying the following equations:

$$0.1 \times (a+b+c) \leq d \leq 3 \times (a+b+c)$$

and $$0.01 \leq [(a+b+c)/e] \leq 3.$$

Still further, in another embodiment of this invention, there is provided a solution for forming superconductive thin films containing: a mol of at least one compound selected from the group A consisting of methoxide, ethoxide, propoxide, butoxide, methoxyethoxide and ethoxyethoxide of a metal selected from Y, La, Nd, Sm, Eu, Gd, Dy, Ho, Er, Tm, Yb and Lu; b mol of at least one compound selected from the group B consisting of methoxide, ethoxide, propoxide, butoxide, methoxyethoxide and ethoxyethoxide of a metal selected from Ba and Sr; c mol of at least one compound selected from the group C consisting of methoxide, ethoxide, propoxide, butoxide, methoxyethoxide and ethoxyethoxide of Cu; d mol of at least one compound selected from the group D consisting of monoethanolamine, diethanolamine, triethanolamine, mono-2-propanolamine, di-2-propanolamine, acetylacetone, ethylene glycol, diethylene glycol, propylene glycol and dipropylene glycol; and e liter of at least one compound selected from the group E consisting of methanol, ethanol, propanol, butanol, methoxyethanol and ethoxyethanol; and also satisfying the following equations:

$$0.1 \times (a+b+c) \leq d \leq 3 \times (a+b+c)$$

and $$0.01 \leq [(a+b+c)/e] \leq 3.$$

DETAILED DESCRIPTION OF THE PREFERRED EMBODIMENT

It can be deduced that a superconductive thin film to be formed according to the first embodiment of this invention has a composition represented by the following formula:

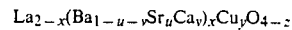

$$La_{2-x}(Ba_{1-u-v}Sr_uCa_v)_xCu_yO_{4-z}$$

wherein u, v, x, y and z are numerals satisfying the following relationships:

$$0 \leq u \leq 1,$$

$$0 \leq v \leq 1,$$

$$0 \leq (u+v) \leq 1,$$

$$0 \leq x \leq 0.3$$

$$0.9 \leq y \leq 1.1$$

and $$0 \leq z \leq 0.1.$$

The content of each of the metal components of the superconductive thin film obtained by the first embodiment can be determined by means of X-ray fluorescence spectroscopy; whereas the oxygen content of the thin film can be determined by means of EPMA (Electron Probe X-ray Microanalyzer). It can further be deduced that the crystal structure of the thin film is of rhombic system as analyzed according to X-ray diffractometry.

If the elements in each component constituting the thin film are compounded at a ratio not included in the range as specified above, other phases which do not exhibit superconductivity may also be present within the thin film to be formed to deteriorate the characteristics of the thin film.

Next, it can be deduced that the superconductive thin film to be formed according to another embodiment of this invention has a composition represented by the following formula:

$$\alpha(Ba_{1-u}Sr_u)_x Cu_y O_{8-z}$$

wherein $\alpha$ represents at least one of Y, La, Nd, Sm, Eu, Gd, Dy, Ho, Er, Tm, Yb and Lu; and u, x, y and z are numerals satisfying the following relationships:

$$0 \leq u \leq 1,$$

$$1.9 \leq x \leq 2.1,$$

$$2.9 \leq y \leq 3.1$$

and $$0.8 \leq z \leq 1.8.$$

The contents of the metal components and oxygen of the thin film can be determined in the same manner as in the first embodiment by means of fluorescent X-ray spectroscopy and EPMA, respectively. Also, it can be deduced that the crystal structure of the thin film is of oxygen-free triple perovskite structure as analyzed by means of X-ray diffractometry.

If the elements in each component constituting the thin film are compounded at a ratio not included in the range as specified above, other phases which do not exhibit superconductivity may also be present within the thin film to be formed to deteriorate the characteristics of the thin film similarly to the first embodiment of this invention.

Referring first to the first embodiment of this invention, description will be made in more detail by way of respective steps.

PROCESS OF PREPARING SOLUTION

First, a solution containing at least one compound selected from each of the groups A, B, C, D and E is prepared.

As the compounds of the group A, at least one of lanthanum methoxide ($La(OCH_3)_3$), lanthanum ethoxide ($La(OC_2H_5)_3$), lanthanum propoxide ($La(OC_3H_7)_3$), lanthanum butoxide ($La(OC_4H_9)_3$), lanthanum methoxyethoxide (($La(OC_2H_4OCH_3)_3$) and lanthanum ethoxyethoxide ($La(OC_2H_4OC_2H_5)_3$) may be used.

As the compounds of the group B, at least one of methoxide, ethoxide, propoxide, butoxide, methoxyethoxide and ethoxyethoxide of a metal selected from Ba, Sr and Ca may be used. The compounds have functional groups of methoxy group ($-OCH_3$), ethoxy group ($-OC_2H_5$), propoxy group ($-OC_3H_7$), butoxy group ($-OC_4H_9$), methoxyethoxy group ($-OC_2H_4OCH_3$), ethoxyethoxy group ($-OC_2H_4OC_2H_5$), respectively.

As compounds of the group C, at least one of copper methoxide ($Cu(OCH_3)_2$), copper ethoxide ($Cu(OC_2H_5)_2$), copper propoxide ($Cu(OC_3H_7)_2$), copper butoxide ($Cu(OC_4H_9)_2$), copper methoxyethoxide ($Cu(OC_2H_4OCH_3)_2$), copper ethoxyethoxide ($Cu(OC_2H_4OC_2H_5)_2$) may be used.

As compounds of the group D, at least one of monoethanolamine, diethanolamine, triethanolamine, mono-2-propanolamine, di-2-propanolamine, acetylacetone, ethylene glycol, diethylene glycol, propylene glycol and dipropylene glycol may be used.

As compounds of the group E, at least one of methanol, ethanol, propanol, butanol, methoxyethanol and ethoxyethanol may be used.

The methoxyethoxide and the ethoxyethoxide as exemplified in the group A, B or C are also referred to as methoxyethylate and ethoxyethylate, respectively.

The propoxide as exemplified in the above group A, B or C may be either 1-propoxide or 2-propoxide, and the butoxide may be any of 1-butoxide, 2-butoxide, isobutoxide and t-butoxide. Also, the propanol as exemplified in the group E may be either 1-propanol or 2-propanol, and further, the butanol may be any of 1-butanol, 2-butanol, isobutanol and t-butanol.

The compounds of the group D are used for inhibiting the metal atoms constituting the compounds in the groups A, B and C from precipitating as particulate hydroxides or oxides through hydrolysis during the processes until calcination to be described later; whereas the compounds of the group E serve as solvents. The compounds selected from the groups D and E are desirably subjected to dehydration treatment by use of molecular sieves and the like in order to inhibit hydrolysis of the compounds of the groups A, B and C when they are mixed with the compounds of the groups D and E.

One compound is usually selected from each of the groups A, C, D and E for use. Although it is possible to use two or more compounds selected from each of these groups, significant difference may not substantially be observed virtually in the superconductive thin film to be obtained as a residue of calcination, since what differentiates these compounds from each other is merely the organic functional groups such as alkoxy group and alkoxyalkoxy group which are the moieties to be volatilized finally during the calcination process to be described later. Thus, it involves rather inconvenience such as increase in cost due to complicated process and so on to use two or more compounds selected from each of these groups. Accordingly, the subsequent procedures need not be changed if any of these compound is selected. Also, significant difference may not be observed in the characteristics of the superconductive thin film to be obtained by use of any compounds selected from each of these groups.

From the group B, one or more compound can be selected for use. When two or more compounds selected from this group are used, they should have a metallic moiety which is different from each other. Namely, the reason is that significant difference may not substantially be obtained virtually in the superconductive thin film to be obtained as a residue of calcination, if two or more compounds which are differentiated from each other merely by the organic functional groups such as alkoxy group and alkoxyalkoxy group are used, since such groups are finally volatilized during the calcination process to be described later.

The ratio of mixing the compounds selected from the groups A, B, C, D and E, which may vary slightly depending on the types of the compounds, must be in the range satisfying both of the following equations:

$$0.1 \times (a+b+c) \leq d \leq 3 \times (a+b+c)$$

and $$0.01 \leq [(a+b+c)/e] \leq 3,$$

provided that the compounds of the groups A, B, C and D are used in an amount of a mol, b mol, c mol and d mol, respectively, and that the compound of the group E is used in an amount of e liter. Namely, in the range of $d < 0.1 \times (a+b+c)$, hydrolysis may not sufficiently be inhibited, whereas in the range of $d > 3 \times (a+b+c)$, the resulting solution comes to have an extremely increased viscosity. In either case, formation of films to be described later will be infeasible. Also, in the range of $[(a+b+c)/e] < 0.01$, the amount of the solvent is excessive, which is not suitable for practical uses. Further, in the range of $[(a+b+c)/e] > 3$, the compounds of the groups A, B and C remain undissolved in certain circumstances. In order to prevent more sufficiently the inconveniences in each of the above cases, the amount of these compounds are preferably in the following range:

$$0.5 \times (a+b+c) \leq d \leq 2 \times (a+b+c)$$

and $$0.1 \leq [(a+b+c)/e] \leq 1.$$

More preferably, in addition to the above condition the following equation is further satisfied respectively.

$$a:b:c = (2-x):x:y$$

wherein x and y are numerals satisfying the following relationships:

$$0 < x \leq 0.3$$

and $$0.9 \leq y \leq 1.1.$$

If x and y are not included within the above range, other phases which do not exhibit superconductivity are also liable to be present to deteriorate sometimes the characteristics of the resulting thin film.

Mixing operation can be carried out by adding at one time the compounds selected from the groups A, B and C to the mixture of the compounds selected from the groups D and E; or by preparing solutions each comprising a mixture of compounds selected from the groups D and E, added thereto a compound selected from the groups A, B and C, respectively, and then mixing predetermined amounts collected from the thus prepared solutions. It should be noted that, since there is a fear that each of the compounds selected from the groups A, B and C may undergo hydrolysis to precipitate in the form of particle depending on the level of water content in the atmosphere, i.e. moisture level, it is desired in order to prevent such phenomenon, not to allow the compounds selected from the groups A, B and C to be exposed to moisture as far as possible, and preferably the mixing operation is conducted such as in a grab box purged with dry nitrogen. However, subsequent operations can be conducted in atmospheric conditions.

FILM-FORMATION PROCESS

Subsequent to the above process, a thin film of the solution prepared above is formed on a heat-resistant substrate.

As the substrate, any material can be used so long as it is resistant to the calcination temperature to be described later, and metals such as gold, silver and platinum; alloys containing at least one of gold silver and platinum as a major component; glass materials such as E glass, S glass, etc.; ceramics such as alumina, alumina silica, magnesia, partially stabilized zirconia, yttria stabilized zirconia, yttria, lanthania, silicon carbide, titanium carbide, silicon nitride, niobium nitride, boron nitride, alkali titanate, potassium lead silicate, strontium titanate, titanium boride, zirconium boride, etc. can be used.

Substrates may take any form, for example, the form of fiber, film, plate or bulk. These substrates may preferably be polished to have smooth surface, further washed to remove dusts deposited on the surface thereof, and degreased to improve wettability with the solution prepared above.

As the mode of film formation, brush coating, roll coating, spray coating, dip coating where a substrate is dipped in the solution and then drawn up therefrom, etc. may be employed. The dip coating is preferred since it is simple and by it, film thickness can be adjusted easily by changing the speed of drawing up the substrate from the solution.

DRYING PROCESS

Next, the thin film of the solution formed on the substrate is dried to evaporate the compound of the group E, so that the thin film may comprise the compounds selected from each of the groups A, B, C and D. This process may be carried out at normal temperature or at a temperature adjusted in the range of about 50° to 100° C.

CALCINATION PROCESS

Finally, the dried film is calcined as carried on the substrate, whereby the desired superconductive thin film represented by the formula as described above can be obtained. The calcination is carried out as follows:

Namely, the dried thin film is placed in an oven, and then heated to the calcination temperature in an oxidative atmosphere, i.e. in air or in an environment where the oxygen concentration is controlled to 20 to 100%. After the thin film is maintained at the temperature for a predetermined time, it is cooled to room temperature.

Heating rate is about 1° to 1,000° C./min.; the calcination temperature is 350° to 1,150° C.; the soaking time is about 5 to 30 minutes; and the cooling rate is about 1° to 1,000° C./min. If the heating rate is lower than 1° C./min., it takes too much time to be suitably employed for practical uses; whereas if it is higher than 1,000° C./min., cracks may sometimes be formed on the film. If the calcination temperature is lower than 350° C., the organic components such as the compounds of the groups D and E as such and the functional groups of the compounds employed may remain within the thin film; whereas if it is higher than 1,150° C., the film may partially be melted or evaporated. If the cooling rate is lower than 1° C./min., it takes too much time to be suitably employed for practical uses; whereas if it is higher than 1,000° C./min., cracks may sometimes be formed on the thin film.

While the first embodiment of this invention has been described heretofore, the embodiment can basically be applied to another embodiment.

Namely, referring to the preparation of the solutions in another embodiment, what is different from the first embodiment is the use of the following compounds as those selected from the groups A and B of all the groups A, B, C, D and E.

That is to say, as the compounds of the group A, at least one of methoxide, ethoxide, propoxide, butoxide, methoxyethoxide and ethoxyethoxide of an element selected from Y, La, Nd, Sm, Eu, Gd, Dy, Ho, Er, Tm, Yb and Lu man be used. The compounds have functional groups of methoxy group, ethoxy group, propoxy group, butoxy group, methoxyethoxy group and ethoxyethoxy group, respectively.

As the compounds of the group B, one or more of methoxide, ethoxide, propoxide, butoxide, methoxyethoxide and ethoxyethoxide of Ba and/or Sr may be used. The compounds have functional groups of methoxy group, ethoxy group, propoxy group, butoxy group, methoxyethoxy group and ethoxyethoxy group, respectively.

The same ratio of mixing the compounds selected from each of the groups A, B, C, D and E as used in the first embodiment can also be used. However, it is preferred in this embodiment that the following ratio:

$$a:b:c = (1 \pm x):(2 \pm y):3$$

wherein x and y are numerals satisfying the following relationships:

$$0 \leq x \leq 0.1$$

and $$0 \leq y \leq 0.1$$

is satisfied, although in the first embodiment the preferred ratio has been specified as follows:

$$a:b:c = (2-x):x:y$$

wherein x and y are numerals satisfying the following relationships $$0 < x \leq 0.3$$

and $$0.9 \leq y \leq 1.1.$$

In this embodiment, the same procedures for thin film formation and drying as used in the first embodiment can be used.

However, the calcination process in this embodiment is somewhat different from that of the first embodiment.

To describe in detail, in this embodiment, there may be employed a heating rate of about 1° to 1,000° C./min., a calcination temperature of 350° to 1,100° C. and a soaking time of about 5 to 30 minutes. Referring to the cooling rate, when a cooling rate of 0.1° to 2° C./min. is used, cooling can be carried out at this rate to room temperature. However, if other cooling rates, particularly high cooling rates of about 2° to 1,000° C./min. are used, such high-speed cooling may be carried out until 500° C., but the cooling rate should be reduced to 0.1° to 2° C./min. from the range of 500° C. to room temperature, otherwise tetragonal crystals may grow within the resulting film and the thin film may not exhibit superconductivity.

However, if such phenomenon should occur, it is possible to make the thin film superconductive by heating it again in an oxidative atmosphere at 300° to 700° C. for 2 hours or more.

EXAMPLES

Example 1

In a grab box through which a dry nitrogen is passed, 0.018 mol of lanthanum methoxide ($La(OCH_3)_3$), 0.002 mol of barium methoxide ($Ba(OCH_3)_2$), and 0.01 mol of copper methoxide ($Cu(OCH_3)_2$ were metered and combined, and 0.03 mol of monoethanolamine and further 100 ml of methanol were added thereto. The resulting mixture was stirred by means of a stirrer for 30 minutes to prepare a solution for coating. On the other hand, 1 mm thick partially stabilized zirconia (PSZ) plate was subjected to ultrasonic cleaning successively with trichloroethylene, acetone, ethanol and pure water for three minutes, respectively, and then dried by blowing thereto a high-purity dry nitrogen.

Next, the above PSZ plate was dipped in the solution obtained above, and after one minute, it was drawn up vertically therefrom at a rate of 10 cm/min. to form a thin film of the solution on the PSZ plate. The solution exhibited very good film-forming properties.

Subsequently, the thin film thus formed was placed in a soaking oven and dried at 50° C. for 30 minutes.

Next, the dried thin film as carried on the PSZ plate was placed in an electric oven and heated to 1,130° C. at a heating rate of 10° C./min. and kept at that temperature for 10 minutes. Then, it was cooled to room temperature at a cooling rate of 50° C./min. to provide a superconductive thin film comprising $La_{1.8}(Ba_1)_{0.2}Cu_1O_4$ as a single phase on the PSZ plate. The superconductive thin film was obtained as a black and lustrous film, and neither contaminant nor cracking was found when observed through an optical microscope at 600 power. The thin film obtained had a thickness of 20 nm, and an onset temperature of superconductive transition ($T_{CE}$) of 42K, an end point of superconductive transition ($T_{CE}$) of 38K, and a critical current density (Jc) of $2 \times 10^6 A/cm^2$.

Incidentally, $T_{CO}$ and $T_{CE}$ were determined according to the following modes, respectively. To describe in detail, four Au electrodes were vapordeposited at regular intervals on the thin film thus formed according to the method described in "Low Temperature Technique" Vol. 7 of "Experimental Physical Engineering" series, p 67, May 31, 1977, Shunichi Kobayashi, published by Tokyo University, and an Au wire was pasted to each electrode using a silver paste. An Au/Fe Chromel thermocouple was bonded to the film at the center thereof, and the whole was placed in a copper sheath. Subsequently, the Au wire terminals of the outer pair of Au electrodes formed on the surface of the film were connected to a constant current source of 0.01 to 10 mA, and the Au wire terminals of the inner pair of the Au electrode formed on the surface of the thin film and the terminals of the thermocouple were connected to different direct-read type voltmeters, respectively.

The copper sheath in which the thus treated thin film is placed was dipped slowly in a liquid helium contained in a Dewar flask and the values indicated by the two direct-read type voltmeters were read every moment. Temperature of the thin film was calculated from the reading of the voltmeter connected to the thermocouple; whereas the resistance of the thin film was calculated from the reading of the voltmeter connected to the Au electrodes formed on the internal surface of the thin film.

The data thus obtained were plotted into a temperature/resistance curve to obtain $T_{CO}$ from this curve. On the other hand, $T_{CE}$ was obtained by reading the maximum value within the temperature where the reading of the voltmeter drops below $4 \times 10^{-7}$V.

Jc was determined in the following manner. To describe in detail, the same procedures following as described above until the copper sheath was dipped at a stretch in a liquid nitrogen contained in a Dewar flask, after the thermocouple was removed from the thin film. Subsequently, power was continuously supplied from the constant current source at an incremental preset current value of 0.1 A until the voltmeter connected to the inner pair of Au electrodes formed on the surface of the thin film indicates a voltage. The present current value Ic immediately before the voltmeter shows a voltage was read, and the read value was divided by the sectional area ($t \times w$, wherein t represents a thickness and w represents a width of the film) to calculate Jc.

EXAMPLES 2 to 30

Solutions comprising various compositions were prepared in the same manner as in Example 1 by using different types of compounds each selected from the groups A, B, C, D and E in different amounts as shown in Table 1. Thin films were formed on PSZ plates using the solutions prepared above in the same manner as in Example 1.

5,001,110

TABLE 1

| | Solution (types and amounts) | | | | | | | | | | | |
|---|---|---|---|---|---|---|---|---|---|---|---|---|
| | Group A Compound | | Group B Compound | | Group C Compound | | | Group D Compound | | Group E Compound | | $\frac{a+b+c}{e}$ mol/l |
| Example No. | Type | a mol | Type | b mol | Type | c mol | a + b + c mol | Type | d mol | Type | e l | |
| 2 | $La(OC_2H_5)_3$ | 0.018 | $Ba(OC_2H_5)_2$ | 0.002 | $Cu(OC_2H_5)_2$ | 0.01 | 0.03 | diethanolamine | 0.03 | ethanol | 0.1 | 0.3 |
| 3 | $La(OC_3H_7)_3$ | 0.018 | $Ba(OC_3H_7)_2$ | 0.002 | $Cu(OC_3H_7)_2$ | 0.01 | 0.03 | triethanolamine | 0.03 | 2-propanol | 0.1 | 0.3 |
| 4 | $La(OC_4H_9)_3$ | 0.018 | $Ba(OC_4H_9)_2$ | 0.002 | $Cu(OC_4H_9)_2$ | 0.01 | 0.03 | mono-2-propanol-amine | 0.03 | 1-butanol | 0.1 | 0.3 |
| 5 | $La(OC_2H_4OCH_3)_3$ | 0.018 | $Ba(OC_2H_4OCH_3)_2$ | 0.002 | $Cu(OC_2H_4OCH_3)_2$ | 0.01 | 0.03 | di-2-propanol-amine | 0.03 | methoxyethanol | 0.1 | 0.3 |
| 6 | $La(OC_2H_4OC_2H_5)_3$ | 0.018 | $Ba(OC_2H_4OC_2H_5)_2$ | 0.002 | $Cu(OC_2H_4OC_2H_5)_2$ | 0.01 | 0.03 | acetylacetone | 0.03 | ethoxyethanol | 0.1 | 0.3 |
| 7 | $La(OC_3H_7)_3$ | 0.018 | $Sr(OC_3H_7)_2$ | 0.002 | $Cu(OC_2H_4OC_2H_5)_2$ | 0.01 | 0.03 | ethylene glycol | 0.03 | methanol | 0.1 | 0.3 |
| 8 | $La(OC_3H_7)_3$ | 0.018 | $Ca(OC_3H_7)_2$ | 0.002 | $Cu(OC_2H_4OC_2H_5)_2$ | 0.01 | 0.03 | diethylene glycol | 0.03 | ethanol | 0.1 | 0.3 |
| 9 | $La(OC_3H_7)_3$ | 0.018 | $Ba(OC_3H_7)_2$ | 0.002 | $Cu(OC_2H_4OC_2H_5)_2$ | 0.01 | 0.03 | propylene glycol | 0.03 | 2-propanol | 0.1 | 0.3 |
| 10 | $La(OC_3H_7)_3$ | 0.018 | $Ba(OC_3H_7)_2$ $Ca(OC_3H_7)_2$ | 0.001 0.001 | $Cu(OC_2H_4OC_2H_5)_2$ | 0.01 | 0.03 | dipropylene glycol | 0.03 | 1-butanol | 0.1 | 0.3 |
| 11 | $La(OC_3H_7)_3$ | 0.018 | $Sr(OC_3H_7)_2$ $Ca(OC_3H_7)_2$ | 0.001 0.001 | $Cu(OC_2H_4OC_2H_5)_2$ | 0.01 | 0.03 | monoethanolamine | 0.03 | methoxymethanol | 0.1 | 0.3 |
| 12 | $La(OC_3H_7)_3$ | 0.018 | $Ba(OC_3H_7)_2$ $Sr(OC_3H_7)_2$ $Ca(OC_3H_7)_2$ | 0.00067 0.00067 0.00067 | $Cu(OC_2H_4OC_2H_5)_2$ | 0.01 | 0.03 | diethanolamine | 0.03 | ethoxyethanol | 0.1 | 0.3 |
| 13 | $La(OC_3H_7)_3$ | 0.02 | — | — | $Cu(OC_2H_4OC_2H_5)_2$ | 0.01 | 0.03 | triethanolamine | 0.03 | methanol | 0.1 | 0.3 |
| 14 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.03 | ethanol | 0.1 | 0.3 |
| 15 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.016 | ethanol | 0.1 | 0.3 |
| 16 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.014 | ethanol | 0.1 | 0.3 |
| 17 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.004 | ethanol | 0.1 | 0.3 |
| 18 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.002 | ethanol | 0.1 | 0.3 |
| 19 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.058 | ethanol | 0.1 | 0.3 |
| 20 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.062 | ethanol | 0.1 | 0.3 |
| 21 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.08 | ethanol | 0.1 | 0.3 |
| 22 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.1 | ethanol | 0.1 | 0.3 |
| 23 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.03 | ethanol | 0.25 | 0.12 |
| 24 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.03 | ethanol | 0.35 | 0.086 |
| 25 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.03 | ethanol | 2.5 | 0.012 |
| 26 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.03 | ethanol | 3.5 | 0.008 |
| 27 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.03 | ethanol | 0.035 | 0.86 |
| 28 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.03 | ethanol | 0.025 | 1.2 |
| 29 | $La(OC_3H_7)_3$ | 0.018 | $Ba(OC_3H_7)_2$ | 0.002 | $Cu(OC_2H_4OC_2H_5)_5$ | 0.01 | 0.03 | diethanolamine | 0.03 | ethanol | 0.012 | 2.5 |
| 30 | $La(OC_3H_7)_3$ | 0.018 | $Ba(OC_3H_7)_2$ | 0.002 | $Cu(OC_2H_4OC_2H_5)_2$ | 0.01 | 0.03 | diethanolamine | 0.03 | ethanol | 0.008 | 3.75 |

The resulting thin films were determined for composition, film state and superconductivity in the same manner as in Example 1, and the results obtained are shown in Table 2.

Overall evaluation for the thin films is also shown in Table 2. In the overall evaluation, the mark means excellent film-forming properties, no contaminants/no cracking in the thin film and good superconductivity; the mark means moderately good film-forming properties, no contaminants/no cracking in the thin film and good superconductivity; and the mark Δ means some difficulty in film formation, presence of some contaminants/cracking in the thin film and poor or no superconductivity.

Incidentally, for the purpose of finding out the influence of the calcination temperature on the thin film properties, dried thin films were formed on PSZ plates using the solution as prepared in Example 14 in the same manner as in Example 1. The thin films as carried on the substrates were then placed in an electric oven and calcined at different calcination temperatures, respectively, wherein four standard calcination temperatures of 300° C., 400° C., 800° C. and 1,200° C. were used. The thin films obtained are listed in Table 2 as Example 31, 32, 33 and 34, together with the states of the film.

TABLE 2

| Example No. | Composition | Film state | Super-Conductivity $T_{CO}$ (K) | $T_{CE}$ (K) | Overall evaluation |
|---|---|---|---|---|---|
| 2 | $La_{1.8}(Ba_1)_{0.2}Cu_1O_4$ | No Contaminant/no cracking | 39 | 36 | |
| 3 | $La_{1.8}(Ba_1)_{0.2}Cu_1O_4$ | No Contaminant/no cracking | 39 | 38 | |
| 4 | $La_{1.8}(Ba_1)_{0.2}Cu_1O_4$ | No Contaminant/no cracking | 42 | 40 | |
| 5 | $La_{1.8}(Ba_1)_{0.2}Cu_1O_4$ | No Contaminant/no cracking | 41 | 39 | |
| 6 | $La_{1.8}(Ba_1)_{0.2}Cu_1O_4$ | No Contaminant/no cracking | 38 | 35 | |
| 7 | $La_{1.8}(Sr_1)_{0.2}Cu_1O_4$ | No Contaminant/no cracking | 40 | 38 | |
| 8 | $La_{1.8}(Sr_1)_{0.2}Cu_1O_4$ | No Contaminant/no cracking | 39 | 37 | |
| 9 | $La_{1.8}(Ba_{0.5}Ca_{0.5})_{0.2}Cu_1O_4$ | No Contaminant/no cracking | 42 | 39 | |
| 10 | $La_{1.8}(Ba_{0.5}Ca_{0.5})_{0.2}Cu_1O_4$ | No Contaminant/no cracking | 38 | 36 | |
| 11 | $La_{1.8}(Sr_{0.5}Ca_{0.5})_{0.2}Cu_1O_4$ | No Contaminant/no cracking | 41 | 36 | |
| 12 | $La_{1.8}(Ba_{0.34}Ca_{0.33}Ca_{0.33})_{0.2}Cu_1O_4$ | No Contaminant/no cracking | 39 | 37 | |
| 13 | $La_2Cu_1O_4$ | No Contaminant/no cracking | 38 | 37 | |
| 14 | $La_{1.8}(Ba_1)_{0.2}Cu_1O_4$ | No Contaminant/no cracking | 42 | 40 | |
| 15 | $La_{1.8}(Ba_1)_{0.2}Cu_1O_4$ | No Contaminant/no cracking | 39 | 36 | |
| 16 | $La_{1.8}(Ba_1)_{0.2}Cu_1O_4$ | No Contaminant/no cracking | 39 | 38 | |
| 17 | $La_{1.8}(Ba_1)_{0.2}Cu_1O_4$ | No Contaminant/no cracking | 42 | 40 | |
| 18 | $La_{1.8}(Ba_1)_{0.2}Cu_1O_4$ | No Contaminant/no cracking | 38 | 34 | Δ |
| 19 | $La_{1.8}(Ba_1)_{0.2}Cu_1O_4$ | No Contaminant/no cracking | 38 | 35 | |
| 20 | $La_{1.8}(Ba_1)_{0.2}Cu_1O_4$ | No Contaminant/no cracking | 40 | 38 | |
| 21 | $La_{1.8}(Ba_1)_{0.2}Cu_1O_4$ | No Contaminant/no cracking | 39 | 37 | |
| 22 | $La_{1.8}(Ba_1)_{0.2}Cu_1O_4$ | No Contaminant/no cracking | 35 | 32 | Δ |
| 23 | $La_{1.8}(Ba_1)_{0.2}Cu_1O_4$ | No Contaminant/no cracking | 42 | 39 | |
| 24 | $La_{1.8}(Ba_1)_{0.2}Cu_1O_4$ | No Contaminant/no cracking | 40 | 39 | |
| 25 | $La_{1.8}(Ba_1)_{0.2}Cu_1O_4$ | No Contaminant/no cracking | 38 | 36 | |
| 26 | $La_{1.8}(Ba_1)_{0.2}Cu_1O_4$ | No Contaminant/no cracking | 39 | 36 | Δ |
| 27 | $La_{1.8}(Ba_1)_{0.2}Cu_1O_4$ | No Contaminant/no cracking | 40 | 38 | |
| 28 | $La_{1.8}(Ba_1)_{0.2}Cu_1O_4$ | No Contaminant/no cracking | 39 | 36 | |
| 29 | $La_{1.8}(Ba_1)_{0.2}Cu_1O_4$ | No Contaminant/no cracking | 38 | 36 | |
| 30 | $La_{1.8}(Ba_1)_{0.2}Cu_1O_4$ | No Contaminant/no cracking | 35 | 32 | Δ |
| 31 | — | Organic components remained | — | — | x |
| 32 | $La_{1.8}(Ba_1)_{0.2}Cu_1O_4$ | No Contaminant/ | 39 | 36 | |

TABLE 2-continued

| Example No. | Composition | Film state | Super-Conductivity $T_{CO}$ (K) | $T_{CE}$ (K) | Overall evaluation |
|---|---|---|---|---|---|
| 33 | $La_{1.8}(Ba_1)_{0.2}Cu_1O_4$ | no cracking No Contaminant/ no cracking | 39 | 38 | |
| 34 | — | Melted | — | — | x |

EXAMPLE 35

In a grab box through which a dry nitrogen is passed, 0.01 mol of yttrium methoxide ($Y(OCH_3)_3$), 0.02 mol of barium methoxide ($Ba(OCH_3)_2$), and 0.03 mol of copper methoxide ($Cu(OCH_3)_2$) were metered and combined, and 0.06 mol of monoethanolamine and further 100 ml of methanol were added successively thereto. The resulting mixture was stirred by means of a stirrer for 30 minutes to prepare a solution for coating.

On the other hand, 1 mm thick PSZ plate was subjected to ultrasonic cleaning successively with trichloroethylene, acetone, ethanol and pure water for three minutes, respectively, and then dried by blowing thereto a high-purity dry nitrogen.

Next, the above PSZ plate was dipped in the solution obtained above, and after one minute, it was drawn up vertically therefrom at a rate of 10 cm/min. to form a thin film of the solution on the PSZ plate. The solution exhibited very good film-forming properties.

Subsequently, the thin film thus formed was placed in a soaking oven and dried at 50° C. for 30 minutes.

Next, the dried thin film as carried on the PSZ plate was placed in an electric oven and heated to 930° C. at a heating rate of 10° C./min. and kept at that temperature for 10 minutes. Then, it was cooled to 500° C. at a rate of 50° C./min. and then to room temperature at a rate of 1° C./min. to provide a superconductive thin film comprising $Y(Ba_1)_2Cu_3O_{6.9}$ as a single phase on the PSZ plate. Neither contaminant nor cracking was found on the superconductive thin film when observed through an optical microscope at 600 power. The thin film obtained had a thickness of 45 nm, and an onset temperature of superconducting transition ($T_{CO}$) of 98K, an end point of superconducting transition ($T_{CE}$) of 96K, and a critical current density of $5 \times 10^6 A/cm^2$.

EXAMPLES 36 to 69

Solutions comprising various compositions were prepared in the same manner as in Example 35 by using different types of compounds each selected from the groups A, B, C, D and E in different number of moles as shown in Table 3. Films were formed on PSZ plates using the solutions prepared above in the same manner as in Example 35.

TABLE 3

Solution (types and amounts)

| Example No. | Group A Compound Type | a mol | Group B Compound Type | b mol | Group C Compound Type | c mol | a + b + c mol | Group D Compound Type | d mol | Group E Compound Type | e l | $\frac{a+b+c}{e}$ mol/l |
|---|---|---|---|---|---|---|---|---|---|---|---|---|
| 36 | Y(OC$_2$H$_5$)$_3$ | 0.01 | Ba(OC$_3$H$_5$)$_2$ | 0.02 | Cu(OC$_2$H$_5$)$_2$ | 0.03 | 0.06 | diethanolamine | 0.06 | ethanol | 0.1 | 0.6 |
| 37 | Y(OC$_3$H$_7$)$_3$ | 0.01 | Ba(OC$_3$H$_7$)$_2$ | 0.02 | Cu(OC$_3$H$_7$)$_2$ | 0.03 | 0.06 | triethanolamine | 0.06 | 2-propanol | 0.1 | 0.6 |
| 38 | Y(OC$_4$H$_9$)$_3$ | 0.01 | Ba(OC$_4$H$_9$)$_2$ | 0.02 | Cu(OC$_4$H$_9$)$_2$ | 0.03 | 0.06 | mono-2-propanol-amine | 0.06 | 1-butanol | 0.1 | 0.6 |
| 39 | Y(OC$_2$H$_4$OCH$_3$)$_3$ | 0.01 | Ba(OC$_2$H$_4$OCH$_3$)$_2$ | 0.02 | Cu(OC$_2$H$_4$OCH$_3$)$_2$ | 0.03 | 0.06 | di-2-propanol-amine | 0.06 | methoxyethanol | 0.1 | 0.6 |
| 40 | Y(OC$_2$H$_4$OC$_2$H$_5$)$_3$ | 0.01 | Ba(OC$_2$H$_4$OC$_2$H$_5$)$_2$ | 0.02 | Cu(OC$_2$H$_4$OC$_2$H$_5$)$_2$ | 0.03 | 0.06 | acetylacetone | 0.06 | ethoxyethanol | 0.1 | 0.6 |
| 41 | La(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | ethylene glycol | 0.06 | methanol | 0.1 | 0.6 |
| 42 | Nd(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | dipropylene glycol | 0.06 | ethanol | 0.1 | 0.6 |
| 43 | Sm(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | propylene glycol | 0.06 | 2-propanol | 0.1 | 0.6 |
| 44 | Eu(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | dipropylene glycol | 0.06 | 1-butanol | 0.1 | 0.6 |
| 45 | Gd(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | monoethanol-amine | 0.06 | methoxyethanol | 0.1 | 0.6 |
| 46 | Dy(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.06 | ethoxyethanol | 0.1 | 0.6 |
| 47 | Ho(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | triethanolamine | 0.06 | methanol | 0.1 | 0.6 |
| 48 | Er(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | mono-2-propanol-amine | 0.06 | ethanol | 0.1 | 0.6 |
| 49 | Tm(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | di-2-propanol-amine | 0.06 | 2-propanol | 0.1 | 0.6 |
| 50 | Yb(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | acetylacetone | 0.06 | 1-butanol | 0.1 | 0.6 |
| 51 | Lu(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | ethylene glycol | 0.06 | methoxyethanol | 0.1 | 0.6 |
| 52 | Y(OC$_3$H$_7$)$_3$ | 0.01 | Sr(OC$_3$H$_7$)$_2$ | 0.02 | Cu(OC$_2$H$_4$OC$_2$H$_5$)$_2$ | 0.03 | 0.06 | diethyl glycol | 0.06 | ethoxyethanol | 0.1 | 0.6 |
| 53 | Y(OC$_3$H$_7$)$_3$ | 0.01 | Ba(OC$_3$H$_7$)$_2$ | 0.01 | Cu(OC$_2$H$_4$OC$_2$H$_5$)$_2$ | 0.03 | 0.06 | propylene glycol | 0.06 | methanol | 0.1 | 0.6 |
|  |  |  | Sr(OC$_3$H$_7$)$_2$ | 0.01 |  |  |  |  |  |  |  |  |
| 54 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.06 | ethanol | 0.1 | 0.6 |
| 55 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.005 | ethanol | 0.1 | 0.6 |
| 56 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.007 | ethanol | 0.1 | 0.6 |
| 57 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.028 | ethanol | 0.1 | 0.6 |
| 58 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.032 | ethanol | 0.1 | 0.6 |
| 59 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.1 | ethanol | 0.1 | 0.6 |
| 60 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.15 | ethanol | 0.1 | 0.6 |
| 61 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.2 | ethanol | 0.1 | 0.6 |
| 62 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.06 | ethanol | 6.5 | 0.009 |
| 63 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.06 | ethanol | 5.0 | 0.012 |
| 64 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.06 | ethanol | 0.65 | 0.92 |
| 65 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.06 | ethanol | 0.58 | 0.103 |
| 66 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.06 | ethanol | 0.065 | 0.92 |
| 67 | Y(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.06 | ethanol | 0.058 | 1.03 |
| 68 | La(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.06 | ethanol | 0.021 | 2.56 |
| 69 | Nd(OC$_3$H$_7$)$_3$ | 0.01 | Ba(OC$_3$H$_7$)$_2$ | 0.02 | Cu(OC$_2$H$_4$OC$_2$H$_5$)$_2$ | 0.03 | 0.06 | diethanolamine | 0.06 | ethanol | 0.019 | 3.16 |

The resulting thin films were determined for composition, film state and superconductivity in the same manner as in Example 35, and the results obtained are shown in Table 4.

Overall evaluation for the thin films is also shown in Table 4. In the overall evaluation, the mark  means excellent film-forming properties, no contaminants/no cracking in the thin film and good superconductivity; the mark  means moderately good film-forming properties, no contaminants/no cracking in the thin film and moderately good superconductivity; and the mark $\Delta$ means some difficulty in film formation, presence of some contaminants/cracking in the thin film and poor or no superconductivity.

Incidentally, for the purpose of finding out the influence of the calcination temperature on the thin film properties, dried thin films were formed on PSZ plates using the solutions as prepared in Example 54 in the same manner as in Example 35. The thin films carried on the substrates were then placed in an electric oven and calcined at different calcination temperatures. respectively, wherein four standard calcination temperatures of 300° C., 400° C., 800° C. and 1,200° C. were used. The thin films obtained are listed in Table 4 as Example 70, 71, 72 and 73, together with the states of the film.

TABLE 4

| Example No. | Composition | Film state | Super-Conductivity $T_{CO}$ (K) | $T_{CE}$ (K) | Overall evaluation |
|---|---|---|---|---|---|
| 36 | $Y(Ba_1)_2Cu_3O_{6.9}$ | No Contaminant/no cracking | 96 | 93 | |
| 37 | $Y(Ba_1)_2Cu_3O_{6.9}$ | No Contaminant/no cracking | 95 | 93 | |
| 38 | $Y(Ba_1)_2Cu_3O_{6.9}$ | No Contaminant/no cracking | 98 | 95 | |
| 39 | $Y(Ba_1)_2Cu_3O_{6.9}$ | No Contaminant/no cracking | 99 | 94 | |
| 40 | $Y(Ba_1)_2Cu_3O_{6.9}$ | Organic components remained | 96 | 93 | |
| 41 | $Y(Ba_1)_2Cu_3O_{6.9}$ | No Contaminant/no cracking | 98 | 93 | |
| 42 | $Nd(Ba_1)_2Cu_3O_{6.9}$ | No Contaminant/no cracking | 99 | 95 | |
| 43 | $Sm(Ba_1)_2Cu_3O_{6.9}$ | No Contaminant/no cracking | 97 | 92 | |
| 44 | $Eu(Ba_1)_2Cu_3O_{6.9}$ | No Contaminant/no cracking | 98 | 93 | |
| 45 | $Gd(Ba_1)_2Cu_3O_{6.9}$ | No Contaminant/no cracking | 95 | 92 | |
| 46 | $Dy(Ba_1)_2Cu_3O_{6.9}$ | No Contaminant/no cracking | 99 | 95 | |
| 47 | $Ho(Ba_1)_2Cu_3O_{6.9}$ | Organic components remained | 96 | 92 | |
| 48 | $Er(Ba_1)_2Cu_3O_{6.9}$ | No Contaminant/no cracking | 97 | 95 | |
| 49 | $Tm(Ba_1)_2Cu_3O_{6.9}$ | No Contaminant/no cracking | 96 | 93 | |
| 50 | $Yb(Ba_1)_2Cu_3O_{6.9}$ | No Contaminant/no cracking | 95 | 93 | |
| 51 | $Lu(Ba_1)_2Cu_3O_{6.9}$ | No Contaminant/no cracking | 95 | 93 | |
| 52 | $Y(Sr_1)_2Cu_3O_{6.9}$ | No Contaminant/no cracking | 95 | 92 | |
| 53 | $Y(Ba_{0.5}Sr_{0.5})_2Cu_3O_{6.9}$ | No Contaminant/no cracking | 97 | 95 | |
| 54 | $Y(Ba_1)_2Cu_3O_{6.9}$ | No Contaminant/no cracking | 98 | 96 | |
| 55 | $Y(Ba_1)_2Cu_3O_{6.9}$ | No Contaminant/no cracking | 95 | 92 | $\Delta$ |
| 56 | $Y(Ba_1)_2Cu_3O_{6.9}$ | Organic components remained | 95 | 93 | |
| 57 | $Y(Ba_1)_2Cu_3O_{6.9}$ | No Contaminant/no cracking | 98 | 95 | |
| 58 | $Y(Ba_1)_2Cu_3O_{6.9}$ | No Contaminant/no cracking | 99 | 94 | |
| 59 | $Y(Ba_1)_2Cu_3O_{6.9}$ | Organic components remained | 96 | 93 | |
| 60 | $Y(Ba_1)_2Cu_3O_{6.9}$ | No Contaminant/no cracking | 97 | 95 | |
| 61 | $Y(Ba_1)_2Cu_3O_{6.9}$ | No Contaminant/no cracking | 95 | 93 | $\Delta$ |
| 62 | $Y(Ba_1)_2Cu_3O_{6.9}$ | No Contaminant/no cracking | 96 | 93 | $\Delta$ |
| 63 | $Y(Ba_1)_2Cu_3O_{6.9}$ | No Contaminant/no cracking | 95 | 93 | |
| 64 | $Y(Ba_1)_2Cu_3O_{6.9}$ | No Contaminant/no cracking | 98 | 95 | |
| 65 | $Y(Ba_1)_2Cu_3O_{6.9}$ | No Contaminant/no cracking | 99 | 94 | |

TABLE 4-continued

| Example No. | Composition | Film state | Super-Conductivity $T_{CO}$ (K) | $T_{CE}$ (K) | Overall evaluation |
|---|---|---|---|---|---|
| 66 | Y(Ba$_1$)$_2$Cu$_3$O$_{6.9}$ | No Contaminant/ no cracking | 96 | 93 | |
| 67 | Y(Ba$_1$)$_2$Cu$_3$O$_{6.9}$ | No Contaminant/ no cracking | 98 | 93 | |
| 68 | Y(Ba$_1$)$_2$Cu$_3$O$_{6.9}$ | No Contaminant/ no cracking | 98 | 95 | |
| 69 | Y(Ba$_1$)$_2$Cu$_3$O$_{6.9}$ | No Contaminant/ no cracking | 96 | 92 | Δ |
| 70 | — | Organic compounds remained | — | — | x |
| 71 | Y(Ba$_1$)$_2$Cu$_3$O$_{6.9}$ | No Contaminant/ no cracking | 88 | 73 | Δ |
| 72 | Y(Ba$_1$)$_2$Cu$_3$O$_{6.9}$ | No Contaminant/ no cracking | 90 | 80 | Δ |
| 73 | — | Melted | — | — | x |

What is claimed is:

1. A solution for forming a superconductive thin film, containing:
   an amount (a) of mols of at least one compound selected from the group A consisting of methoxide, ethoxide, propoxide, butoxide, methoxyethoxide and ethoxyethoxide of La;
   an amount (b) of mols of at least one compound selected from the group B consisting of methoxide, ethoxide, propoxide, butoxide, methoxyethoxide and ethoxyethoxide of a metal selected from Ba, Sr and Ca;
   an amount (c) of mols of at least one compound selected from the group C consisting of methoxide, ethoxide, propoxide, butoxide, methoxyethoxide and ethoxyethoxide of Cu;
   an amount (d) of mols of at least one compound for inhibiting hydrolysis selected from the group D consisting of monoethanolamine, diethanolamine, triethanolamine, mono-2-propanolamine, di-2-propanolamine, acetylacetone, ethylene glycol, diethylene glycol, propylene glycol and dipropylene glycol; and
   an amount (e) of liters of at least one compound selected from the group E consisting of methanol, ethanol, propanol, butanol, methoxyethanol and ethoxyethanol; and also satisfying the following questions:

$$0.1 \times (a+b+c) \leq d \leq 3 \times (a+b+c)$$

and $$0.01 \leq \{(a+b+c)/e\} \leq 3.$$

2. The solution according to claim 1, wherein said compounds selected from the groups D and E are preliminarily subjected to dehydration treatment, respectively.

3. The solution according to claim 1, said solution satisfying the following relationships:

$$0.5 \times (a+b+c) \leq d \leq 2 \times (a+b+c)$$

and $$0.1 \leq [(a+b+c)/e] \leq 1.$$

4. The solution according to claim 1, said solution further satisfying the following relationship:

$$a:b:c = (2-x):x:y,$$

wherein x and y are numerals satisfying the following relationships:

$$0 < x \leq 0.3$$

and $$0.9 \leq y \leq 1.1.$$

5. The solution according to claim 1, wherein the operation of mixing said compound selected from the group A, said compound selected from the group B and said compound selected from the group C is carried out in a dry nitrogen atmosphere.

6. A solution for forming a superconductive thin film, containing:
   an amount (a) of mols of at least one compound selected from the group A consisting of methoxide, ethoxide, propoxide, butoxide, methoxyethoxide and ethoxyethoxide of a metal selected from Y, La, Nd, Sm, Eu, Gd, Dy, Ho, Er, Tm, Yb and Lu;
   an amount (b) of mols of at least one compound selected from the group B consisting of methoxide, ethoxide, propoxide, butoxide, methoxyethoxide and ethoxyethoxide of a metal selected from Ba and Sr;
   an amount (c) of mols of at least one compound selected from the group C consisting of methoxide, ethoxide, propoxide, butoxide, methoxyethoxide and ethoxyethoxide of Cu;
   an amount (d) of mols of at least one compound for inhibiting hydrolysis selected from the group D consisting of monoethanolamine, -diethanolamine, triethanolamine, mono-2-propanolamine, di-2-propanolamine, acetylacetone, ethylene glycol, diethylene glycol, propylene glycol and dipropylene glycol; and
   an amount (e) of liters of at least one compound selected from the group E consisting of methanol, ethanol, propanol, butanol, methoxyethanol and ethoxyethanol; and also satisfying the following questions:

$$0.1 \times (a+b+c) \leq d \leq 3 \times (a+b+c)$$

and $$0.01 \leq \{(a+b+c)/e\} \leq 3.$$

7. The solution according to claim 6, wherein said compounds selected from the groups D and E are preliminarily subjected to dehydration treatment, respectively.

8. The solution according to claim 6, wherein said solution satisfies the following relationships:

$$0.5\times(a+b+c) \leqq d \leqq 2\times(a+b+c)$$

and $$0.1 \leqq [(a+b+c)/e] \leqq 1.$$

9. The solution according to claim 8, wherein said solution further satisfies the following relationship:

$$a:b:c = (1\pm x):(2\pm y):3,$$

wherein x and y are numerals satisfying the following relationships:

$$0 \leqq x \leqq 0.1$$

and $$0 \leqq y \leqq 0.1.$$

10. The solution according to claim 6, wherein the operation of mixing said compound selected from the group A, said compound selected from the group B and said compound selected from the group C is carried out in a dry nitrogen atmosphere.

* * * * *